(12) United States Patent
Oguri

(10) Patent No.: US 7,838,444 B2
(45) Date of Patent: Nov. 23, 2010

(54) SEMICONDUCTOR DEVICE AND FABRICATION METHOD OF THE SAME

(75) Inventor: Hiroyuki Oguri, Yamanashi (JP)

(73) Assignee: Eudyna Devices Inc., Nakakoma-Gun, Yamanashi (JP)

( * ) Notice: Subject to any disclaimer, the term of this patent is extended or adjusted under 35 U.S.C. 154(b) by 589 days.

(21) Appl. No.: 11/654,497

(22) Filed: Jan. 18, 2007

(65) Prior Publication Data

US 2007/0167031 A1    Jul. 19, 2007

(30) Foreign Application Priority Data

Jan. 19, 2006  (JP) .............................. 2006-011780

(51) Int. Cl.
*H01L 21/318* (2006.01)
*H01L 33/46* (2006.01)

(52) U.S. Cl. ...................................... 438/792; 438/791

(58) Field of Classification Search ...................... None
See application file for complete search history.

(56) References Cited

U.S. PATENT DOCUMENTS 5,985,771 A * 11/1999 Moore et al. ................ 438/791
7,291,911 B2 * 11/2007 Usami ........................ 257/693

FOREIGN PATENT DOCUMENTS

JP        2005-317572 A    11/2005

* cited by examiner

*Primary Examiner*—Zandra Smith
*Assistant Examiner*—Pamela E Perkins
(74) *Attorney, Agent, or Firm*—Westerman, Hattori, Daniels & Adrian, LLP

(57) ABSTRACT

A fabrication method of a semiconductor device includes forming a silicon nitride layer on a compound semiconductor layer with a plasma CVD method and selectively treating the compound semiconductor layer with use of the silicon nitride layer for a mask. The silicon nitride layer has a refraction index of less than 1.85. The compound semiconductor layer includes Ga.

13 Claims, 6 Drawing Sheets

SEMICONDUCTOR DEVICE AND FABRICATION METHOD OF THE SAME

BACKGROUND OF THE INVENTION

1. Field of the Invention

This invention generally relates to a semiconductor device and a fabrication method of the same, and in particular, relates to a semiconductor device having a silicon nitride layer on a semiconductor layer and a fabrication method of the same.

2. Description of the Related Art

A semiconductor luminescent device such as a semiconductor laser emitting a light or a light-emitting diode (LED), or a semiconductor optical receiver such as a photo diode receiving a light is used in a field of an optical communication or an optical memory media. Japanese Patent Application Publication No. 2005-317572 discloses a semiconductor laser as an optical semiconductor device that has a ridge-type stripe structure.

In the semiconductor laser, an active layer emitting a laser light is, for example, between an n-type semiconductor layer and a p-type semiconductor layer. When a current is applied between the n-type semiconductor layer and the p-type semiconductor layer, a laser light is emitted. In the photo diode, a light is detected when a current flowing between an n-type semiconductor layer and a p-type semiconductor layer is detected, the current being caused by a carrier being excited by a light received at an receiving layer between the n-type semiconductor layer and the p-type semiconductor layer.

In the semiconductor device, there is a demand for reducing a resistance of a conductive layer such as a contact resistance between the n-type or the p-type semiconductor layer as a conductive layer in the compound semiconductor layer and the electrode. And there is a demand for limiting a leak current in an interface between the compound semiconductor layer and an insulating layer.

SUMMARY OF THE INVENTION

The present invention provides a semiconductor device where a resistance of a conductive layer in a compound semiconductor layer is reduced or where a leak current between the compound semiconductor layer and an insulating layer is limited, and provides a fabrication method of the semiconductor device.

According to an aspect of the present invention, preferably, there is provided a fabrication method of a semiconductor device. The method includes forming a silicon nitride layer on a compound semiconductor layer with a plasma CVD method and selectively treating the compound semiconductor layer with use of the silicon nitride layer for a mask. The silicon nitride layer has a refraction index of less than 1.85. The compound semiconductor layer includes Ga.

With the above-mentioned configuration, it is possible to reduce a resistance of a conductive layer in the compound semiconductor layer, or it is possible to limit a leak current in an interface between the silicon nitride layer and the compound semiconductor layer.

According to another aspect of the present invention, preferably, there is provided a fabrication method of a semiconductor device. The method includes forming a silicon nitride layer on a compound semiconductor layer with a plasma CVD method and forming a protective layer denser than the silicon nitride layer on the silicon nitride layer. The silicon nitride layer has a refraction index of less than 1.85. The compound semiconductor layer includes Ga.

With the above-mentioned configuration, it is possible to reduce a resistance of a conductive layer in the compound semiconductor layer, or it is possible to limit a leak current in an interface between the silicon nitride layer and the compound semiconductor layer. And it is possible to improve a humidity resistance of the semiconductor device.

According to another aspect of the present invention, preferably, there is provided a semiconductor device including a compound semiconductor layer, a silicon nitride layer and a protective layer. The compound semiconductor layer includes Ga and is provided on a substrate. The silicon nitride layer is provided on the compound semiconductor layer and has a refraction index of less than 1.85. The protective layer is provided on the silicon nitride layer and is denser than the silicon nitride layer.

With the above-mentioned configuration, it is possible to reduce a resistance of a conductive layer in the compound semiconductor layer, or it is possible to limit a leak current in an interface between the silicon nitride layer and the compound semiconductor layer. And it is possible to improve a humidity resistance of the semiconductor device.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1:
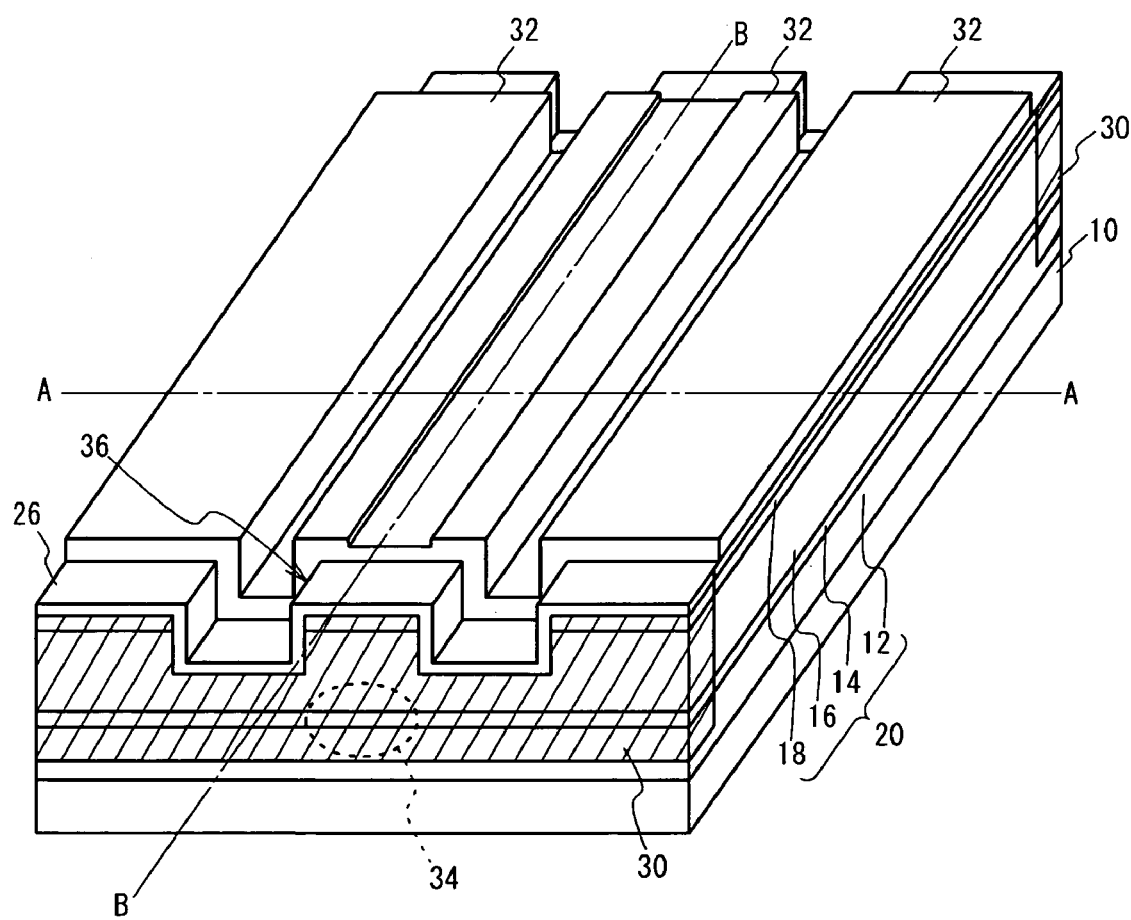
FIG. 1 illustrates a perspective view of a semiconductor laser in accordance with a first embodiment.
Figure 2A:
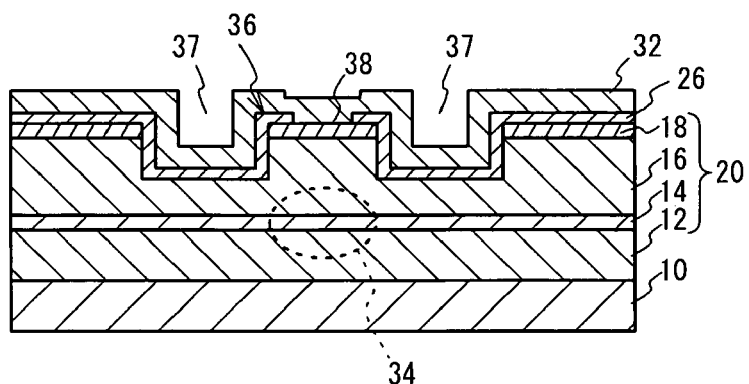
FIG. 2A and FIG. 2B illustrate a cross sectional view of the semiconductor device in accordance with the first embodiment.
Figure 2B:
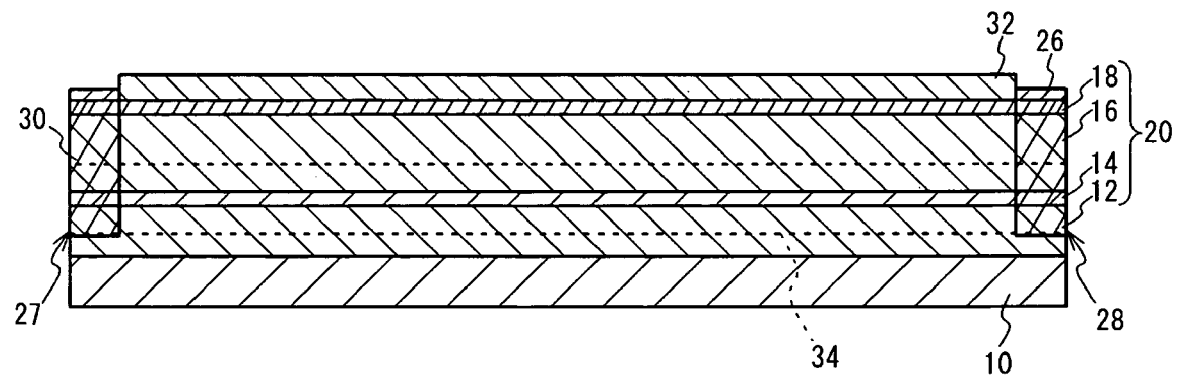

A first embodiment is an example of a semiconductor laser that emits a wavelength of 660 nm and has a ridge. FIG. 1 illustrates a perspective view of a semiconductor laser in accordance with a first embodiment. FIG. 2A illustrates a cross sectional view taken along a line A-A of FIG. 1. FIG. 2B illustrates a cross sectional view taken along a line B-B of FIG. 1. As shown in FIG. 1, FIG. 2A and FIG. 2B, an n-type clad layer 12, an active layer 14, a p-type clad layer 16 and a p-type contact layer 18 are provided on an n-type GaAs substrate 10. A compound semiconductor layer 20 is composed of the n-type clad layer 12, the active layer 14, the p-type clad layer 16 and the p-type contact layer 18.

As shown in FIG. 2A, a part of the p-type contact layer 18 and a part of the p-type clad layer 16 are eliminated, and a recess 37 is formed. A ridge 36 is composed of a part of the p-type contact layer 18 and a part of the p-type clad layer 16. The ridge 36 is formed between the recesses 37. That is, the compound semiconductor layer 20 includes the ridge 36.

A silicon nitride layer 26 is provided on the p-type clad layer 16 and on a side face and a top face of the ridge 36. The silicon nitride layer 26 is composed of a silicon nitride layer having a refraction index of less than 1.85 and a protective layer on the silicon nitride layer, the protective layer being composed of silicon nitride denser than the silicon nitride layer. The silicon nitride layer 26 is arranged to be in contact with at least a part of the top layer of the ridge 36. An opening 38 is formed in the silicon nitride layer 26 above the p-type contact layer 18, in the ridge 36.

An electrode 32 is provided on the silicon nitride layer 26 and in the opening 38. The electrode 32 ohmically contacts to the p-type contact layer 18 through the opening 38. As shown in FIG. 2A and FIG. 2B, a diffusion region 30 is provided on ends of the compound semiconductor layer 20 in a B-B line direction.

As shown in FIG. 2A, the active layer 14 is between the n-type clad layer 12 and the p-type clad layer 16 that have a low refraction index. A light transmitting in the compound semiconductor layer 20 is housed in the active layer 14 and the around. An equivalent refraction index with respect to a light transmitting in the active layer 14 and the around under the ridge 36 is higher than that in the active layer 14 and the around under the recesses 37 on the both sides of the ridge 36. Therefore, the light transmitting in the active layer 14 and the around is housed in the active layer 14 and the around under the ridge 36. A region, in which the light transmitting in the active layer 14 and the around, is referred to a waveguide 34. The ridge 36 is a convexity formed on the compound semiconductor layer 20 where the waveguide 34 is to be formed. When a current is applied between the electrode 32 and the substrate 10, a light generated in the active layer 14 is housed in the waveguide 34 as mentioned above.

As shown in FIG. 2B, a light in the waveguide 34 is reflected at an end face 27 and an end face 28, the end faces being on the both sides of the compound semiconductor layer 20 respectively. Thus, a light inductively emitted in the waveguide 34 is emitted from the end face 27 as a laser light.

A description will be given of a fabrication method of the semiconductor laser in accordance with the first embodiment, with reference to FIG. 3A through FIG. 5C. FIG. 3A through FIG. 3C, FIG. 4A, and FIG. 4C through FIG. 5C correspond to a cross sectional view taken along the line A-A of FIG. 1. FIG. 3D and FIG. 4B correspond to a cross sectional view taken along the line B-B of FIG. 1.

Figure 3A:
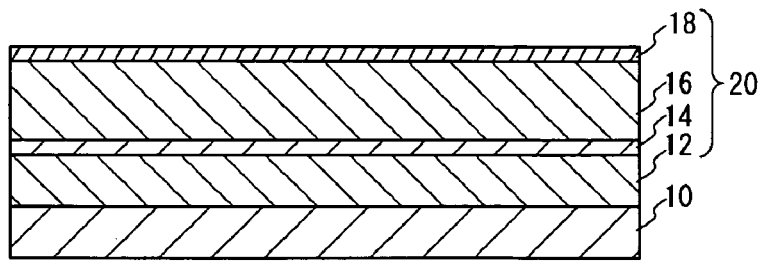
FIG. 3A through FIG. 3D illustrate a fabrication process of the semiconductor device in accordance with the first embodiment.

As shown in FIG. 3A, the n-type clad layer 12 composed of an AlGaInP layer, the active layer 14 composed of a multi-quantum well (MQW) of InGaP/AlGaInP, the p-type clad layer 16 composed of an AlGaInP layer and the p-type contact layer 18 composed of a GaAs layer in which Zn is doped are grown on the n-type GaAs substrate 10 with a MOCVD method. Through the process, the compound semiconductor layer 20 is fabricated. That is, the compound semiconductor layer 20 includes the p-type contact layer 18 at the top layer thereof.

Figure 3B:
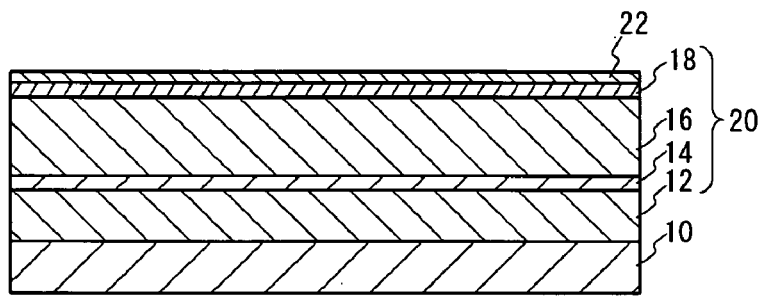

As shown in FIG. 3B, the silicon nitride layer 22 is formed on the p-type contact layer 18 with a plasma CVD method. That is, the silicon nitride layer 22 contacts to the p-type contact layer 18 that is a conductive layer. In a case where the silicon nitride layer 22 is formed, a flow ratio of $SiH_4$, $NH_3$ and $N_2$ is 3:7:1000. A degree of vacuum is 900 mTorr. An RF frequency is 13.56 MHz. An RF power is 50 W. A temperature of the substrate 10 is 300 degrees C. The RF power may be increased or a percentage of $NH_3$ may be increased, in order to reduce the refraction index of the silicon nitride layer. The flow ratio of $SiH_4$, $NH_3$ and $N_2$ may be 3 to 10:5 to 10:1000, the degree of vacuum may be 800 mTorr to 1000 mTorr, the RF power may be 50 W to 100 W, and the temperature of the substrate 10 may be 300 degrees C. to 350 degrees C. in order to form a silicon nitride layer having a refraction index of less than 1.85.

Figure 3C:
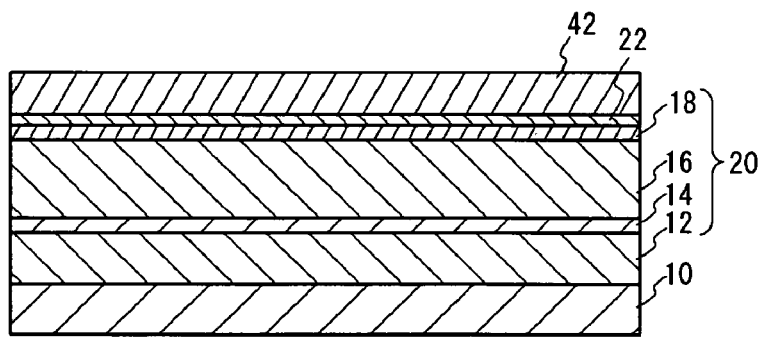
Figure 3D:
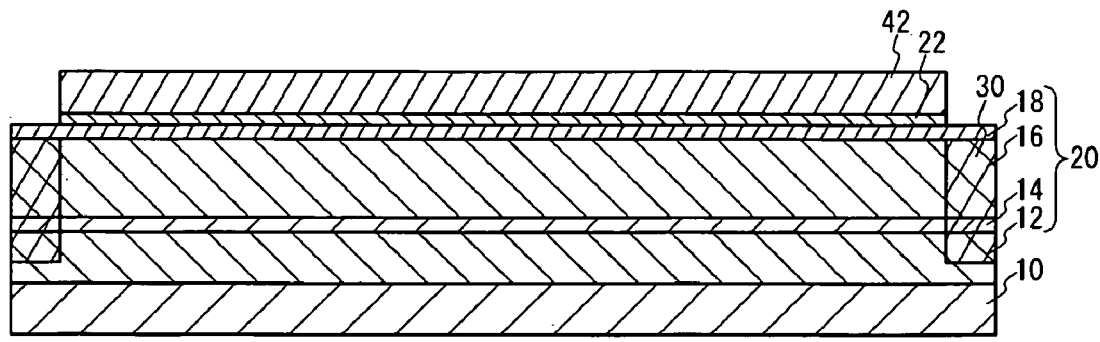

As shown in FIG. 3C and FIG. 3D, a photo resist 42 is formed on the silicon nitride layer 22, the photo resist 42 having openings where a diffusion region is to be formed. A part of the silicon nitride layer 22 is eliminated with use of the photo resist 42 for a mask. The photo resist 42 is eliminated. After that, the silicon nitride layer 22 is used as a mask and the diffusion-region 30, in which Zn or the like is doped, is formed in the compound semiconductor layer 20.

Figure 4A:
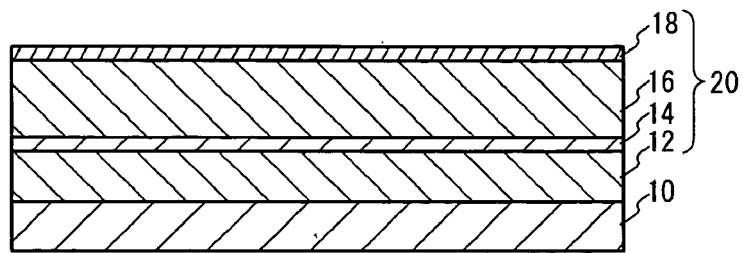
FIG. 4A through FIG. 4D illustrate a fabrication process of the semiconductor device in accordance with the first embodiment.
Figure 4B:
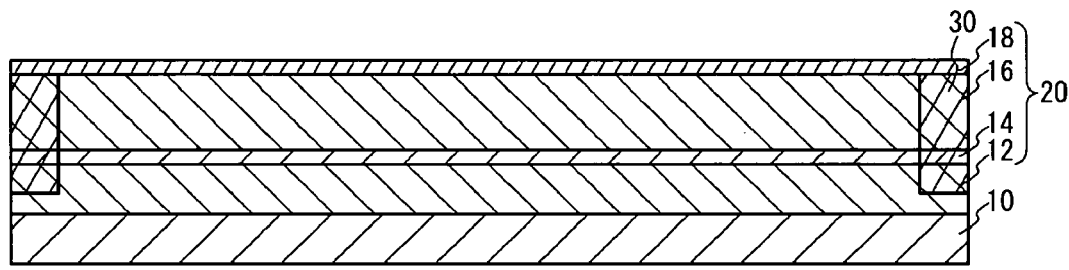
Figure 4C:
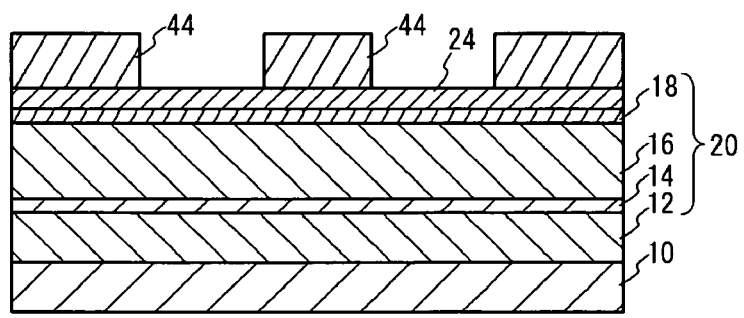
Figure 4D:
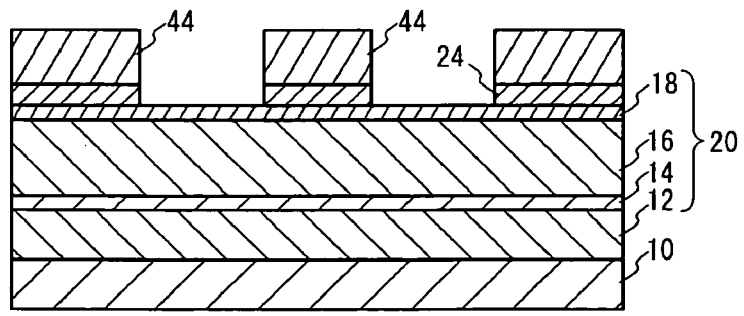

As shown in FIG. 4A and FIG. 4B, the silicon nitride layer 22 is eliminated. Through the processes, the diffusion region 30 is fabricated on the ends of the compound semiconductor layer 20 in the B-B line direction in which the light is emitting. As shown in FIG. 4C, the silicon nitride layer 24 is formed on the p-type contact layer 18. The silicon nitride layer 24 is formed in a same condition as in the case of the silicon nitride layer 22. The silicon nitride layer 24 may have a structure in which the silicon nitride layer and another silicon nitride layer denser than the silicon nitride layer are layered. A photo resist 44 is formed on the silicon nitride layer 24. The photo resist 44 is used when the recess 37 is formed. As shown in FIG. 4D, a part of the silicon nitride layer 24 is eliminated with use of the photo resist 44 for a mask.

Figure 5A:
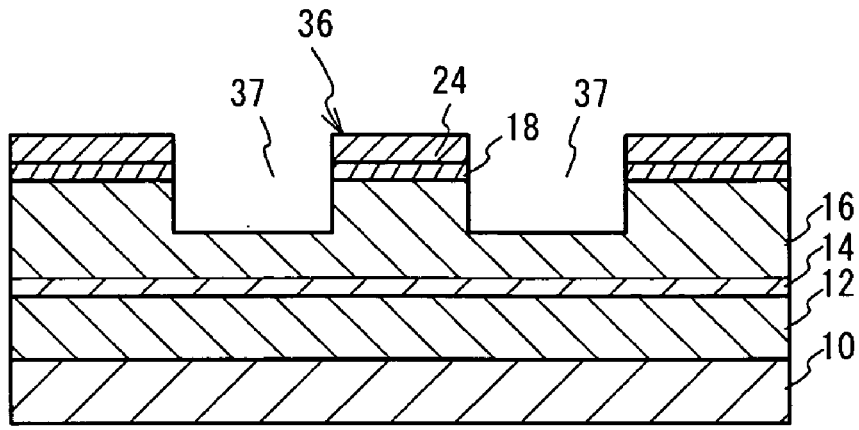
FIG. 5A through FIG. 5C illustrate a fabrication process of the semiconductor device in accordance with the first embodiment.

As shown in FIG. 5A, the photo resist 44 is eliminated. The silicon nitride layer 24 is used as a mask. Parts of the p-type contact layer 18 and parts of the p-type clad layer 16 are eliminated so that parts of the p-type clad layer 16 are exposed. Therefore, the recesses 37 and the ridge 36 between the recesses 37 are formed. In other words, an exposed part of the p-type contact layer 18 where the silicon nitride layer 24 is not formed and a part of the p-type clad layer 16 are etched, the p-type contact layer 18 being a part of the compound semiconductor layer 20. And the ridge 36 is formed.

Figure 5B:
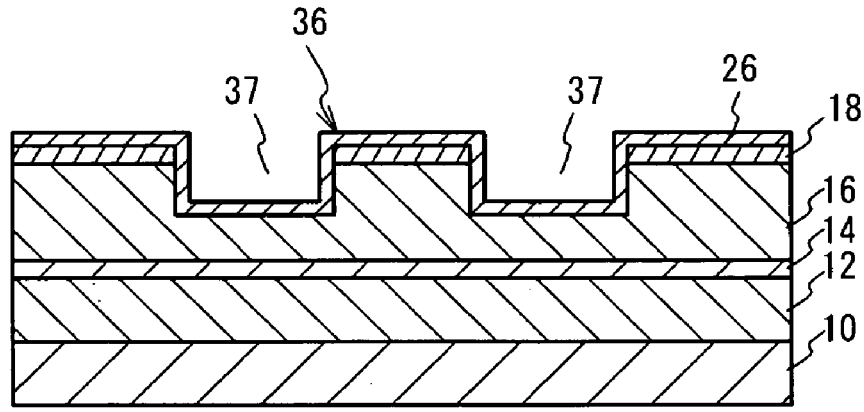

As shown in FIG. 5B, the silicon nitride layer 26 is formed on the p-type clad layer 16, on the side face of the ridge 36 and on the top face of the p-type contact layer 18. That is, the silicon nitride layer is formed on at least a part of the top layer of the ridge 36. The silicon nitride layer 26 has a bilayer structure including a lower layer formed in the same condition as in the case of the silicon nitride layer 22 and a protective layer. The protective layer is denser than the silicon nitride layer 26 and is composed of a silicon nitride having a refraction index of more than 2.0.

Figure 5C:
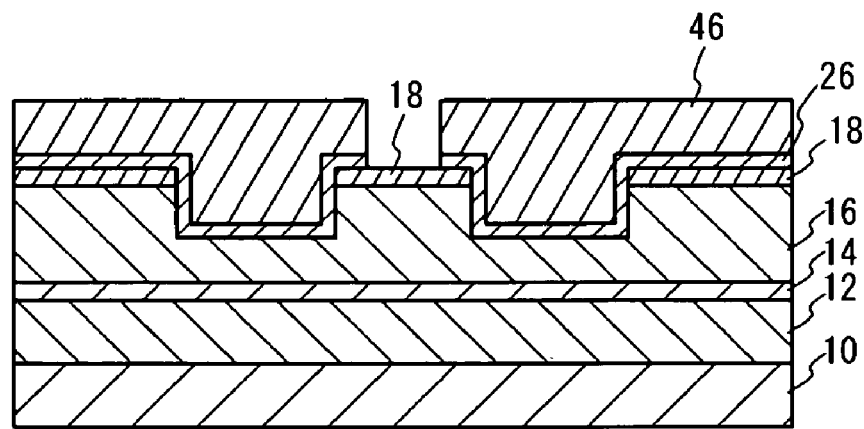

As shown in FIG. 5C, a photo resist 46 is formed on the silicon nitride layer 26. An opening is formed in the photo resist 46 on the ridge 36. The photo resist 46 is used as a mask and the silicon nitride layer 26 is etched. The photo resist 46 is eliminated. Ti, Mo, and Au are formed in order with an evaporation method or a sputtering method. In this process, the electrode 32 is formed. In other words, the silicon nitride layer 26 on the ridge 36 is eliminated and the electrode 32 is formed. In FIG. 5B, all or a part of the silicon nitride layer 26 may be left and the electrode 32 may be formed after eliminating the part of the silicon nitride layer 26. Through the processes above, the semiconductor laser in accordance with the first embodiment is fabricated.

When the semiconductor laser operates at a high temperature more than 70 degrees C. or outputs more than 250 mW, a kink may be occurred in an optical output-to-current property as in the case of FIG. 3 in the Document 1. It is thought that one of the reasons of the kink is an increase of temperature in the waveguide 34. When the temperature in the waveguide 34 increases, the differential of the refraction index between the waveguide 34 and the other area is enlarged. Therefore, a light is housed in the waveguide 34 more advantageously. However, an increase of injected carrier density is limited because of stimulated emission at the middle of the waveguide 34 having a higher optical density. And the carrier density in the middle of the waveguide 34 is lower than that around thereof. Therefore, an emission pattern at the end face is shifted in a transverse direction, or a peak of optical output intensity is separated into more than one peak. And a kink may be occurred in the optical output-to-current property. It is thought that one reason of the temperature increase of the waveguide 34 is an element resistance between the electrode 32 and the substrate 10. When the element resistance is high, the temperature of the waveguide 34 increases during high-power operation.

Figure 6:
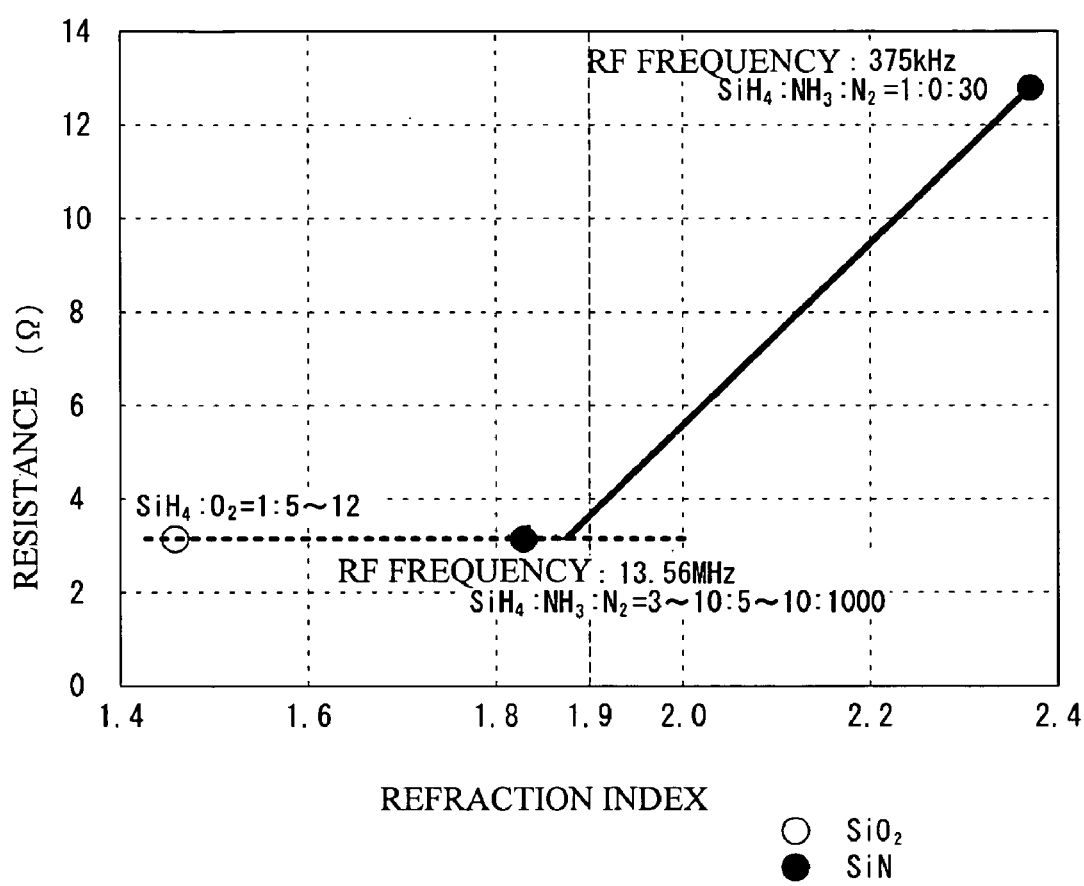
FIG. 6 illustrates a relationship between a refraction index of a silicon nitride layer and an element resistance of the semiconductor device in accordance with the first embodiment.

FIG. 6 illustrates a relationship between the element resistance between the electrode 32 and the substrate 10 and the refraction index of the silicon nitride layers 22, 24 and 26 in a case where the length of the waveguide 34, the length of the ridge 36 is 2000 μm and the width of the ridge 36 is 2 μm. Here, the oxide silicon layer is formed when the flow ratio of $SiH_4$ and $O_2$ is 1:5 to 12. The silicon nitride layer having a refraction index of less than 1.85 is formed with a plasma-CVD method when the RF frequency is 13.56 MHz and the flow ratio of $SiH_4$, $NH_3$ and $N_2$ is 3 to 10:5 to 10:1000. The silicon nitride layer having a refraction index of more than 2.3 is formed with a plasma-CVD method when the RF frequency is 375 kHz and the flow ratio of $SiH_4$ and $N_2$ is 1:30. As shown in FIG. 6, the element resistance is reduced when the refraction index of the silicon nitride layers 22, 24 and 26 is low.

Generally, a silicon nitride layer having a refraction index of more than 2.0 is used. It is because that the silicon nitride layer is dense and has a high humidity resistance when the refraction index thereof is more than 2.0, and that the silicon nitride layer is preferable to used as a protective layer. For example, the silicon nitride layer having the refraction index of more than 2.0 is used as a mask for a selective process such as the etching mask in FIG. 5A or the diffusion mask in FIG. 3D. In a case where the silicon nitride layer having the refraction index of more than 2.0 is used as the protective layer, it is possible to form a layer without more than one condition in the fabrication process if the silicon nitride layer is used in a selective process. And the silicon nitride layer is advantageous.

However, the silicon nitride layer having the refraction index of less than 1.85 is used in the embodiment, because of the knowledge below. A reason, why the element resistance is reduced when the refraction index of the silicon nitride layers 22, 24 and 26 is low, is thought as below. When a silicon nitride layer having a refraction index of more than 2.0 is formed on a GaAs layer, Ga included in the GaAs layer diffuses into the silicon nitride layer and a Ga vacancy is generated in the GaAs layer. A point defect such as the Ga vacancy is in an n-type impurity level. The carrier density is reduced if a p-type carrier is compensated. And the element resistance is enlarged. When the index of the silicon nitride layers 22, 24 and 26 is reduced, it is limited that Ga included in The GaAs layer diffuses into the silicon nitride layer. The number of the point defects in the GaAs layer is reduced, and the compensation of the p-type carrier is limited. And the element resistance is reduced. A mean free path of an ion in plasma gets longer when the RF frequency in the plasma CVD process is lower. Therefore, a crystal defect is generated in the p-type contact layer 18 by an ion collision and a density of the p-type carrier is reduced, in the initial process of deposition of the silicon nitride layer. Therefore, it is preferable that the RF frequency is more than 2 MHz, and it is more preferable that the RF frequency is more than 10 MHz. When the RF frequency is less than 2 MHz as shown in FIG. 6, the element resistance is 10Ω with the affection of the refraction index.

As shown in FIG. 6, when an oxide silicon layer is provided instead of the silicon nitride layer, the element resistance is approximately 3Ω. Supposing that there is little Ga diffusion into an oxide silicon layer when the oxide silicon layer is provided, it is preferable that the silicon nitride layer having a refraction index of less than 1.85 is provided, because the element resistance is less than 3Ω. It is more preferable that the silicon nitride layer having a refraction index of less than 1.8 is provided. Further, it is more preferable that the silicon nitride layer having a refraction index of less than 1.7 is provided, in order to limit the Ga diffusion into the silicon nitride layer.

It is possible to limit that Ga vacancy between the compound semiconductor layer 20 and the silicon nitride layers 22, 24 and 26 is generated, when the refraction index of the silicon nitride layers 22, 24 and 26 adjacent to the compound semiconductor layer 20 is less than 1.85. And it is possible to reduce a leak current in an interface between the compound semiconductor layer 20 and the silicon nitride layer 26. And it is possible to reduce a leak current between the electrode 32 and the substrate 10. In a case where a layer contacting to the silicon nitride layers 22, 24 and 26 of the compound semiconductor layer 20 is not conductive, it is possible to limit the leak current. It is preferable that the refraction index of the silicon nitride layers 22, 24 and 26 is less than 1.85. At least one of the silicon nitride layers 22, 24 and 26 may be less than 1.85.

It is possible to reduce a contact resistance of the electrode 32 and the p-type contact layer 18, when the electrode 32 ohmically contacting to the conductive p-type contact layer 18 is provided.

The compound semiconductor layer 20 includes the ridge 36, and the silicon nitride layers 22, 24 and 26 are provided so as to contact to at least a part of the top layer of the ridge 36. In an optical semiconductor device including a ridge, it is possible to reduce a resistance of a conductive layer in a compound semiconductor layer, or it is possible to limit a leak current between the compound semiconductor layer and an insulating layer.

A layer contacting to the silicon nitride layers 22, 24 and 26 in the compound semiconductor layer 20 is a compound semiconductor layer including Ga. GaN, AlGaN, GaAs, AlGaInP, InGaP or the like may be used as the compound semiconductor layer. It is, in particular, possible to limit that the Ga vacancy is generated. It is possible to reduce the element resistance, and is possible to limit the leak current.

In the first embodiment, the description is given of the diffusion process and the forming process of the ridge 36 of a semiconductor luminescent device as a process of selectively treating the compound semiconductor layer with use of the silicon nitride layers having a refraction index of less than 1.85 for a mask, the diffusion process being a process where an impurity is doped into the compound semiconductor layer 20 with use of the silicon nitride layer 22 for a mask as shown in FIG. 3D, the forming process being a process where the p-type contact layer 18 and the p-type clad layer 16 of the compound semiconductor layer 20 are etched with use of the silicon nitride layer 24 for a mask as shown in FIG. 5A. The selective process may be a process of ion injection.

As shown in FIG. 5B, a protective layer composed of a silicon nitride layer is formed on the silicon nitride layer having a refraction index of less than 1.85, the protective layer being denser than the silicon nitride layer and having a low water permeability. It is possible to limit the leak current between the electrode 32 and the substrate 10 and is possible to obtain the humidity resistance. The silicon nitride layer is a denser if the silicon nitride layer has a refraction index of less than 2.0. And it is possible to obtain the humidity resistance more advantageously.

In the first embodiment, a description is given of an example of a semiconductor laser that emits a wavelength of 660 nm from the end face thereof. This invention can be adapted to a semiconductor laser such as other end face-emitting-semiconductor laser and a surface-emitting-semiconductor laser, a luminous element such as a light-emitting diode, an optical detector such as a photodiode or an avalanche photodiode having a p-n junction and a p-i-n junction. The invention may be adapted to a transistor such as FET. If the invention is adapted to the FET, a silicon nitride layer having a refraction index of less than 1.85 may be provided on a compound semiconductor layer between a gate and a drain. In this case, it is possible to limit a leak current in an interface between the compound semiconductor layer and the silicon nitride layer. And it is possible to obtain the humidity resistance in a case where, on a silicon nitride layer having a refraction index of less than 1.85, a silicon nitride layer denser than the silicon nitride is provided.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2006-011780 filed on Jan. 19, 2006, the entire disclosure of which is hereby incorporated by reference.

What is claimed is:

1. A fabrication method of a semiconductor device comprising:
    forming a silicon nitride layer on a compound semiconductor layer with a plasma CVD method,
    the silicon nitride layer having a refraction index of less than 1.85,
    the compound semiconductor layer including Ga; and
    selectively treating the compound semiconductor layer with use of the silicon nitride layer for a mask.

2. The method as claimed in claim 1, wherein the step of selectively treating is an etching process.

3. The method as claimed in claim 1, wherein the step of selectively treating is a process where an impurity is doped into the compound semiconductor layer.

4. The method as claimed in claim 1, wherein the step of selectively treating is a process where a ridge of a semiconductor luminescent device is formed by etching a part of the compound semiconductor layer exposed in an area except for the mask area.

5. The method as claimed in claim 4 further comprising eliminating at least a part of the mask on the ridge and forming a contact electrode.

6. The method as claimed in claim 1, wherein the silicon nitride layer is formed in a condition where a flow ratio of $SiH_4$, $NH_3$ and $N_2$ is 3 to 10:5 to 10:1000 and an RF frequency is more than 2 MHz.

7. The method as claimed in claim 1, wherein the compound semiconductor layer including Ga is one of GaN, AlGaN, GaAs, AlGaInP and InGaP.

8. A fabrication method of a semiconductor device comprising:
    forming a silicon nitride layer on a compound semiconductor layer with a plasma CVD method,
    the silicon nitride layer having a refraction index of less than 1.85,
    the compound semiconductor layer including Ga; and
    forming a protective layer denser than the silicon nitride layer on the silicon nitride layer.

9. The method as claimed in claim 8, wherein a refraction index of the protective layer is more than 2.0.

10. The method as claimed in claim 8 further comprising forming a ridge of a semiconductor luminescent device by etching a part of the compound semiconductor layer exposed in an area except for a mask area,
    the mask being composed of the silicon nitride layer only or being composed of laminating of the silicon nitride layer and the protective layer.

11. The method as claimed in claim 10 further comprising eliminating at least a part of the mask on the ridge and forming a contact electrode.

12. The method as claimed in claim 8, wherein the silicon nitride layer is formed in a condition where a flow ratio of $SiH_4$, $NH_3$ and $N_2$ is 3 to 10:5 to 10:1000 and an RF frequency is more than 2 MHz.

13. The method as claimed in claim 8, wherein the compound semiconductor layer including Ga is one of GaN, AlGaN, GaAs, AlGaInP and InGaP.

* * * * *